United States Patent [19]

Kniepkamp et al.

[11] 4,173,063
[45] Nov. 6, 1979

[54] FABRICATION OF A SEMICONDUCTOR COMPONENT ELEMENT HAVING A SCHOTTKY CONTACT AND LITTLE SERIES RESISTANCE UTILIZING SPECIAL MASKING IN COMBINATION WITH ION IMPLANTATION

[75] Inventors: Hermann Kniepkamp; Walter Kellner, both of Munich, Fed. Rep. of Germany

[73] Assignee: Siemens Aktiengesellschaft, Berlin & Munich, Fed. Rep. of Germany

[21] Appl. No.: 811,875

[22] Filed: Jun. 30, 1977

[30] Foreign Application Priority Data

Jul. 15, 1976 [DE] Fed. Rep. of Germany ....... 2631873

[51] Int. Cl.$^2$ .................. H01L 21/265; H01L 29/48; H01L 29/80
[52] U.S. Cl. .................................... 29/571; 29/576 B; 29/578; 29/580; 148/1.5; 148/187; 357/15; 357/22; 357/61; 357/71; 357/91; 427/84
[58] Field of Search .................. 148/1.5, 187; 29/571, 29/576 B, 578, 580; 427/84; 357/15, 23, 91, 22, 61, 71

[56] References Cited

U.S. PATENT DOCUMENTS

| 3,653,978 | 4/1972 | Robinson et al. ..................... 148/1.5 |
| 3,739,237 | 6/1973 | Shannon ............................ 29/571 X |
| 3,775,192 | 11/1973 | Beale ................................ 148/1.5 |
| 3,895,966 | 7/1975 | MacDougall et al. ............... 148/1.5 |
| 3,912,546 | 10/1975 | Hunsperger et al. ................ 148/1.5 |
| 4,029,522 | 6/1977 | De La Moneda ................... 148/1.5 |
| 4,033,788 | 7/1977 | Hunsperger et al. ............ 148/187 X |
| 4,063,964 | 12/1977 | Peressini et al. ................... 357/15 X |

OTHER PUBLICATIONS

DeWitt, D., "Field Effect Transistor", IBM Tech. Discl. Bull., vol. 9, No. 1, Jun. 1966, p. 102.

Primary Examiner—L. Dewayne Rutledge
Assistant Examiner—W. G. Saba
Attorney, Agent, or Firm—Hill, Van Santen, Steadman, Chiara & Simpson

[57] ABSTRACT

The invention relates to a semiconductor component element, in particular a Schottky field-effect transistor with a low series resistance, as well as a process for the production thereof.

By means of a novel masking technique, it is possible for the channel region to be implanted as well as the source and drain regions, in a single implantation step. Only one photomask is necessary. By a novel masking arrangement, only a small fraction of the radiated ions get through to the region of the substrate where the channel is to be formed. This enables the formation of a Schottky contact where the channel will be formed. The source and drain regions are formed by allowing a much higher portion of the ions to reach such regions. This allows ohmic contacts to be formed on the source and drain. Thus, in the implantation of the dopant particles, regions are formed with different layer resistances in the semiconductor substrate. The thus produced field-effect transistor has low series resistance between the ohmic contacts and the active zones, without the Schottky contact being adversely influenced. Diodes and other active components may also be produced in a similar manner.

A component element produced by the process is also disclosed which particularly finds use in the production of electronic circuits.

11 Claims, 6 Drawing Figures

FABRICATION OF A SEMICONDUCTOR COMPONENT ELEMENT HAVING A SCHOTTKY CONTACT AND LITTLE SERIES RESISTANCE UTILIZING SPECIAL MASKING IN COMBINATION WITH ION IMPLANTATION

INTRODUCTION

This invention relates to a semiconductor component element having a Schottky contact, and a process for the production thereof.

BACKGROUND OF THE INVENTION

In semiconductor technology, component elements are known in which an electrode is used as a Schottky contact, such, for example, as Schottky field-effect transistors and Schottky diodes. These component elements are usually constructed in the following manner: On a substrate having a high ohmic resistance, which consists, for example, of semi-insulating gallium arsenide, a thin layer of a monocrystalline material is deposited by an epitaxial process, for example by gas-phase epitaxy, melting epitaxy, or by a molecular beam epitaxy. This thin layer of monocrystalline material represents the active layer of the component element. For the "Intern. Electronic Devices Meeting," Washington, D.C. (1975) Techn. Digest, pp. 585-587, a process is known in which a high-ohmic epitaxial layer is applied on a high-ohmic gallium arsenide substrate, and this high-ohmic layer is then doped with the aid of ion implantation. From "Electronic Letters" 9 (1973), pp. 577-578, a process is known in which the ion implantation into the high-ohmic substrate material is carried out, and in which a thinly doped layer is produced in this manner.

The semiconductor component elements in which an electrode consisting of a Schottky contact are distinguished by their short switching time. The switching characteristics of these component elements are, however, often unfavorably influenced by parasitic resistances which are present in the element. These resistances are occasioned by the active semiconductor layers used in these component elements, the thicknesses of which semiconductor layers generally lie in a range between 200 and 500 nm. These parasitic resistances show themselves to be obstructive particularly in the integration of Schottky field-effect transistors for logic circuits, since with circuits of this type the Schottky field-effect transistors are generally constructed as so-called "normally off" field effect transistors, in which the active layer has an even lesser thickness vis-a-vis the normal mode of construction. The thickness of the active layer is smaller in this type of component element than the thickness of the depletion layer of barrier which exists under the Schottky contact when no gate voltage is applied to it.

With the semiconductor material dopings of about $10^{17}$ cm$^{-3}$ which are compatible with these demands of an element of this type, the thickness of the active layer, for example, with gallium arsenide, will amount to less than 100 nm. If, for example, with Schottky field-effect transistors, ohmic contacts for the source and drain electrodes are placed at both sides of the gate, then between these contacts and the active channel zone which is situated under the Schottky field-effect electrode of the component element, as a result of the very slight thickness of the layer through which the current flow occurs, there exists in each case a high feed line resistance, which may also be referred to as a series resistance. A corresponding situation is true as well for the ohmic contact to the semiconductor in a Schottky diode. As a result of such high series resistances, however, the high frequency characteristics and the switching times of the component element are strongly negatively influenced. It is an essential object in the construction of such component elements to minimize these series resistances. This can be achieved either in the doping, or in the thickness, or on the other hand, if possible, not only the doping but also the thickness of the parts of the active semiconductor layer serving as a feed line must be as large as possible.

It is possible to reduce the feed line resistances in that, according to a process known from "Solid-State Electronics" 18 (1975), pp. 977-981, a thin layer with a charge carrier concentration of about $7 \cdot 10^{18}$ cm$^{-3}$ is produced in GaAs with the aid of an ion implantation of tellurium. A layer of this kind has, to be sure, a small series resistance for the ohmic contacts applied on it. However, no Schottky contact can be constructed in this kind of layer because such a high doping concentration would prevent the formation of a depletion layer in the region of the Schottky contact electrode.

SUMMARY OF THE INVENTION

It is an object of the invention to indicate measures by means of which, in semiconductor component elements having a Schottky electrode, the series resistances of the ohmic contacts leading to the active zone are reduced, without the Schottky contact of the component element being adversely influenced.

In a semiconductor component element, this objective is accomplished in a manner hereafter to be described.

By means of a novel masking technique, the channel region as well as the source and drain regions are formed in a single ion implantation step and by using only a single mask. This is accomplished by forming a photo-sensitive lacquer on a low doped semiconductor substrate. By locally etching this lacquer layer, a recess is formed in a planar surface of the substrate. The remaining portion of the lacquer layer and the base of said recess are then covered with a silicon dioxide layer. The thickness of the SiO$_2$ layer is selected in such a way that in a subsequent implantation step a prescribed portion of the implanted atoms is absorbed in the SiO$_2$ implantation mask. A single sulphur implantation step is now carried out with a kinetic energy of 100 keV. If the thickness of the SiO$_2$ layer is 126 nm, only 16% of the radiated ions penetrate into the part of the substrate located under the SiO$_2$ layer. Thus, by a single implantation step, the source and drain regions have high doping with low resistance and the channel region has low doping with relatively high resistance.

The remaining portion of the SiO$_2$ layer is then removed and the electrodes are formed for the source and drain regions and for the channel region.

The production of a semiconductor component element according to the present invention can be done in such a way that, in a first implantation step, all of those parts of the component element are doped whose conductivity is to be large. The area at which the Schottky contact is to be attached is covered by a first mask in the process. In the process of this invention, the region of the Schottky contact is implanted with an ion dose which is 10 to 100 times less vis-a-vis the dose received in the region where the source and drains are located.

The advantage of the process herein described lies particularly in the fact that only one implantation step and only one tempering of the activation of implanted dopant materials is undertaken, and as a result of which, sources of error associated with a multiple implantation are avoided.

THE DRAWINGS

The invention will now be described with reference to the following figures of the drawing:

FIGS. 1 to 6 schematically illustrate the sequence of a preferred process, and

FIG. 6 also schematically illustrates the finished semiconductor component element.

DESCRIPTION OF THE PREFERRED EMBODIMENTS

Figure 1:
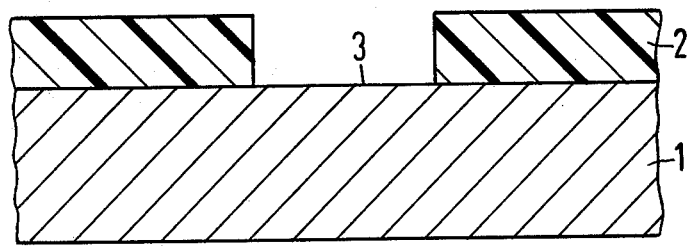
Figure 2:
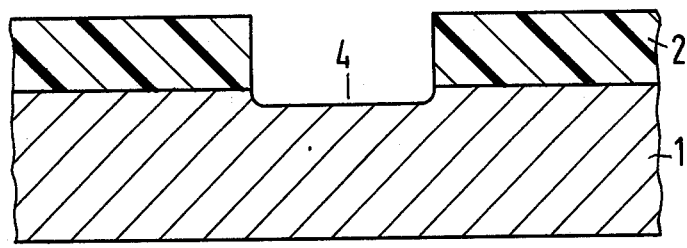
Figure 3:
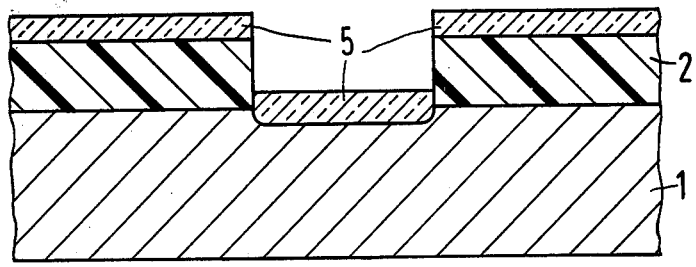
Figure 4:
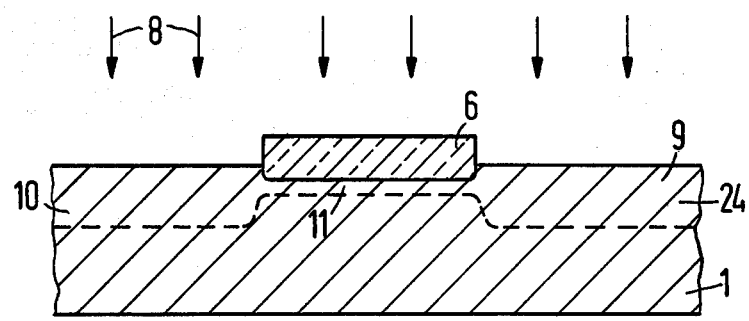
Figure 5:
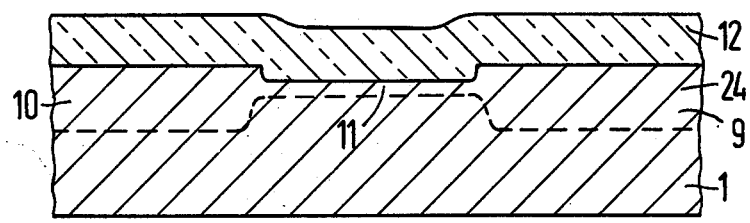
Figure 6:
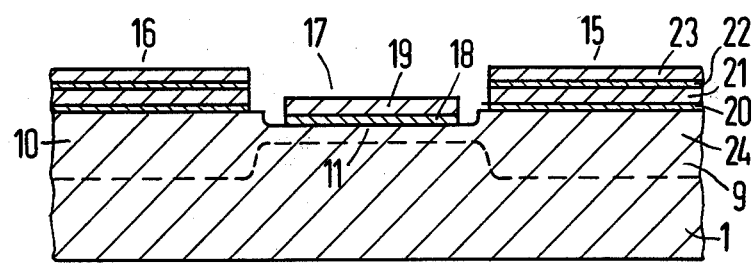

In a first process step a photo-sensitive lacquer layer 2 is applied on a gallium arsenide substrate 1. This photo-sensitive lacquer layer is subsequently exposed through a mask and then developed, so that that area of the substrate on which the Schottky gate electrode is to be applied is no longer covered. Subsequently, in an etching operation, a depression is etched in on the area 3 of the gallium arsenide substrate 1 which has been freed of the photo-sensitive lacquer. In the next process step, a layer 5 of silicon dioxide is applied over the whole surface of the photo-sensitive lacquer, as well as on the exposed part 4 of the substrate, which is done, for example, by sputtering-on. The thickness of this silicon dioxide layer is selected in such a way that, in the subsequent implantation step, a prescribed portion of the implanted atoms is absorbed in the silicon dioxide implantation mask. If the subsequent implantation is carried out with sulphur atoms of a kinetic energy of 100 keV, and if the thickness of the silicon dioxide layer is selected to be equal to 126 nm, then only 16% of the radiated ions penetrate into the part of the semiconductor 1 situated under the silicon dioxide layer. Instead of sulphur, the implantation can also be carried out with ions of the elements Si, Te or Se. In that connection, it must be taken into consideration that these ions are absorbed in varying degrees during the implantation, in the implantation mask. If, for example, 16% of the radiated ions are to be let through by an implantation mask consisting of $SiO_2$, and if the energy of the ions amounts to 100 or, respectively, 300 kev, then the values to be found in the following table result for the necessary thickness of the mask:

| Type of the Ions | S | Si | Se | Te | Kinetic Energy of the Ions |
|---|---|---|---|---|---|
| Thickness of the $SiO_2$ Mask in nm | 126 | 144 | 61 | 58 | 100 keV |
|  | 412 | 265 | 171 | 110 | 300 kV |

In the next process step the photo-sensitive lacquer layer 2 is removed by further development. In the process, the parts of the silicon dioxide layer situated on the photo-sensitive lacquer layer are also raised and removed. After the removal of the photo-sensitive lacquer a residual layer 6 of the silicon dioxide layer 5 remains in the depression 4 of the gallium arsenide substrate, this residual layer 6 projecting partially over the surface of the substrate. In the next process step the entire component element is irradiated from the surface with sulphur ions 8, the GaAs being kept at a temperature of 150° to 500° C. These sulphur ions have, for example, a kinetic energy of 100 keV. The total dosage of the radiated sulphur ions amounts to $10^{13}$ to $10^{14}$ ions per $cm^2$. In the regions 9 and 10 the sulphur ions penetrate deeper into the gallium arsenide substrate 1 than in the region 11 covered by the silicon dioxide layer 6. After the implantation procedure, the silicon dioxide layer 6 is etched away. Subsequent thereto, the sample is provided over its entire surface with a covering layer 12 of silicon nitride, which is done, for example, by the sputtering on of silicon nitride. The silicon nitride layer has a thickness between 100 and 200 nm. This cover layer 12 has the function, during the healing of the radiation damage, of preventing an out-diffusion of arsenic and a decomposition of the GaAs surface which is associated therewith. For the material of the cover layer 12, $SiO_2$, AlN and $Al_2O_3$ are also suitable.

Subsequent to the application of the silicon nitride layer the component element is tempered at a temperature between 800° and 900° C. for a period of about twenty minutes. In the tempering procedure, the implanted sulphur atoms are electrically activated.

After the tempering procedure, the silicon nitride layer is removed by means of an etching agent, for example, with the aid of hydrofluoric acid. In the implantation operation and the subsequent activation by means of tempering, areas 9, 10, which were not covered by the silicon dioxide layer 6, have been more highly doped than the substrate area 11 situated under the silicon dioxide layer 6. At the points at which the edges of the silicon dioxide layer 6 have been located, these areas 10 and 9 partially go over into the area 11 which has between 10 and 100 times lower a doping. Thereafter, the metal contact layers 15 and 16 are applied onto the high-doped areas 9 and 10. These metal contact layers 15 and 16 should not cover the weakly doped channel area 11, but should reach as close as possible to it. For the application of these metal contact layers 15 and 16, a removal process is used, in which initially a photosensitive lacquer layer is applied over the entire area of the surface of the gallium arsenide substrate and it is then partially removed by exposure and development. Subsequent thereto, the arrangement is vapor-deposited with a metal layer over its entire surface, and then the part of the photosensitive lacquer which is still present is removed by further development. In the process, the part of the metal layer which has been situated on this photosensitive lacquer layer is also removed. If a contact exposure process is used for the photosensitive lacquer, then a minimal spacing of 0.5 μm is achievable for the spacing of the metal contact layer 15 and 16 from the edges of the more weakly doped channel zone 11. If an eletron beam exposure process is used, an approximate spacing of 0.1 μm can be obtained. Metal contacts 15 and 16 consist preferably in each case of a layer sequence which consists of a circa 10 nm thick germanium layer 20, and 140 nm thick gold layer 21, a 40 nm thick chromium layer 22, and a 160 nm thick gold layer 23.

The Schottky contact 17 is formed in the area of the depression 4. It consists of a layer sequence of a chromium layer 18 and a gold layer 19, the chrome layer 18 being applied onto the gallium arsenide with a thickness of about 10 nm; and subsequently a gold layer 19 of 300 nm is applied onto the chromium layer.

It will be apparent to those skilled in the art that many modifications and variations may be effected without departing from the spirit and scope of the novel concepts of the present invention.

We claim as our invention:

1. Process for the production of a semiconductor component element with a Schottky contact, in which a layer bordering on the surface of a high-ohmic semiconductor body is doped by means of ion implantation, which includes the following steps:
   (a) application of a layer of photosensitive lacquer onto a surface of a high ohmic semiconductor body;
   (b) exposure and development of said photosensitive lacquer so that an area of said semiconductor body intended for the Schottky contact is freed from said photosensitive lacquer;
   (c) etching a depression in said semiconductor body at said points freed from said photosensitive lacquer;
   (d) application of a masking layer on said photosensitive lacquer layer and on the areas of said semiconductor body free of said photosensitive lacquer;
   (e) development of said photosensitive lacquer and removing parts of said masking layer situated on said photosensitive lacquer;
   (f) irradiation of said semiconductor body which has a residual layer of said masking layer with ions having a doping effect, in which connection the thickness of said residual layer and the kinetic energy of said ions are selected in such a way that the area of said semiconductor body lying under said residual layer is doped 10 to 100 times weaker than the areas bordering thereon;
   (g) etching away of said residual layer;
   (h) application of a covering layer onto said semiconductor body;
   (i) tempering said semiconductor body provided with said covering layer;
   (j) etching away said covering layer;
   (k) application of source and of drain contacts on said semiconductor body with the aid of a removal technique; and
   (l) application of a Schottky contact on said semiconductor body in the area of said depression.

2. Process according to claim 1, in which for said masking layer, one of the materials of a group consisting of $SiO_2$, $Si_3N_4$, $Al_2O_3$, AlN is used.

3. Process according to claim 1, in which said semiconductor body is gallium arsenide, and in which said ions are ions of at least one of the elements of a group consisting of S, Si, Se, Te.

4. Process according to claim 1, in which the implantation is done at a temperature of the semiconductor body of between 150° C. and 500° C.

5. Process according to claim 1, in which the depression is etched away to a depth of between 500 to 100 nanometers.

6. Process according to claim 1, in which said masking layer is a silicon dioxide layer with a thickness of between 80 and 140 nanometers.

7. Process according to claim 1, in which the cover layer is one of a group of materials consisting of $Si_3N_4$, $SiO_2$, AlN, $Al_2O_3$.

8. Process according to claim 1, in which the cover layer has a thickness of between 100 and 200 nanometers.

9. Process according to claim 1, in which the tempering is carried out at a temperature of between 800° C. and 900° C. for a time between 5 minutes and 60 minutes.

10. Process for the production of a semiconductor component having a Schottky contact which includes:
    (a) covering one planar surface of a semiconductor substrate with a photosensitive lacquer layer;
    (b) etching an opening through said lacquer layer where a Schottky contact is to be formed;
    (c) forming a silicon dioxide layer over the remaining portion of said lacquer layer and over the substrate surface lying at the base of said opening;
    (d) removing said lacquer layer and all of said $SiO_2$ layer except where the Schottky contact is to be formed;
    (e) in a single ion implantation step, irradiating said substrate on the side where said $SiO_2$ portion remains;
    (f) the thickness of said $SiO_2$ layer being chosen and the irradiation kinetic energy of the ions that the relative doping in the region of said substrate below said silicon dioxide layer is 10 to 100 times less than the doping of the remaining region adjacent the said one surface;
    (g) formimg a covering layer of silicon nitride thereover;
    (h) tempering said component;
    (i) removing said silicon nitride layer;
    (j) forming ohmic contacts on the surface areas where said substrate is highly doped; and
    (k) forming a Schottky contact on the surface region of said substrate where the substrate has low doping from the irradiation step.

11. Process for the production of a semiconductor component having a Schottky contact which includes:
    (a) covering one planar surface of a gallium arsenide substrate with a photosensitive lacquer layer;
    (b) etching an opening through said lacquer layer where a Schottky contact is to be formed;
    (c) forming a silicon dioxide layer over the remaining portion of said lacquer layer and over the substrate surface lying at the base of said opening;
    (d) removing said lacquer layer and all of said $SiO_2$ layer except where the Schottky contact is to be formed;
    (e) in a single ion implantation step, irradiating said substrate on the side where said $SiO_2$ portion remains while keeping said GaAs substrate at a temperature of between 150° C. and 500° C;
    (f) the thickness of said $SiO_2$ layer being chosen and the irradiation kinetic energy of the ions that the relative doping in the region of said substrate below said silicon dioxide layer is 10 to 100 times less than the doping of the remaining region adjacent the said one surface;
    (g) forming a covering layer of silicon nitride thereover;
    (h) tempering said component by keeping the gallium arsenide substrate at a temperature of between 800° C. and 900° C. for 5 to 60 minutes;
    (i) removing said silicon nitride layer;
    (J) forming ohmic contacts on the surface areas where said substrate is highly doped; and
    (k) forming a Schottky contact on the surface region of said substrate where the substrate has low doping from the irradiation step.

* * * * *